(12) United States Patent
Ito

(10) Patent No.: US 8,230,309 B2
(45) Date of Patent: Jul. 24, 2012

(54) MAXIMUM LIKELIHOOD DETECTOR, ERROR CORRECTION CIRCUIT AND MEDIUM STORAGE DEVICE

(75) Inventor: Toshio Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1278 days.

(21) Appl. No.: 11/982,126

(22) Filed: Nov. 1, 2007

(65) Prior Publication Data

US 2008/0104489 A1 May 1, 2008

(30) Foreign Application Priority Data

Nov. 1, 2006 (JP) ................................. 2006-297442
May 10, 2007 (JP) ................................. 2007-125221

(51) Int. Cl.
*H03M 13/03* (2006.01)
*G11C 29/00* (2006.01)
(52) U.S. Cl. .................. 714/794; 714/759; 714/764
(58) Field of Classification Search .................. 714/794, 714/759, 764
See application file for complete search history.

(56) References Cited

U.S. PATENT DOCUMENTS

| | | | |
|---|---|---|---|
| 5,577,053 A * | 11/1996 | Dent | ............................... 714/755 |
| 6,336,202 B1 | 1/2002 | Tsuchimoto et al. | |
| 6,411,452 B1 * | 6/2002 | Cloke | ............................. 360/51 |
| 6,470,473 B1 | 10/2002 | Iwasa | |
| 6,553,536 B1 | 4/2003 | Hassner et al. | |
| 2007/0245220 A1 | 10/2007 | Ito et al. | |

FOREIGN PATENT DOCUMENTS

| | | |
|---|---|---|
| CN | 1340923 | 3/2002 |
| EP | 1 841 074 A2 | 10/2007 |
| JP | 4-372779 | 12/1992 |
| JP | 7-254860 | 10/1995 |
| JP | 9-93142 | 4/1997 |
| JP | 11-96684 | 4/1999 |
| JP | 11-330985 | 11/1999 |
| JP | 2000-165259 | 6/2000 |
| JP | 2002-100127 | 4/2002 |
| JP | 2002-343037 | 11/2002 |
| JP | 2006-109019 | 4/2006 |

OTHER PUBLICATIONS

"Testing for Threshold Cointegration in Vector Error Correction Models" Bruce E. Hansen, University of Wisconsin and Byeongseon Seo Soongsil University Jul. 2000 Revised: Jun. 2001.*
Hobbs, C.; , "Universality of blank-correction and error-detection (Corresp.)," Information Theory, IEEE Transactions on , vol. 13, No. 2, pp. 342-343, Apr. 1967.*

(Continued)

*Primary Examiner* — Cynthia Britt
(74) *Attorney, Agent, or Firm* — Fujitsu Patent Center

(57) ABSTRACT

A maximum likelihood decoder creates a decoding target data string and provides error candidates that are effective for an error correction circuit. The decoder has a detector for creating a decoding target data string, and an error candidate extractor for extracting the bit positions of which likelihood of each bit shows a high probability of error as the error candidates of the decoding target data string based on the likelihood information from the detector. Since only the bit positions of which error probability is high are extracted as error candidates, a correction circuit can extract the error candidates in the sequence of the lower likelihood, and the number of times of sorting in the sequence of likelihood can be decreased.

15 Claims, 13 Drawing Sheets

OTHER PUBLICATIONS

Xianren Wu; Sadjadpour, H.R.; Zhi Tian; , "A new adaptive two-stage maximum-likelihood decoding algorithm for linear block codes," Communications, IEEE Transactions on , vol. 53, No. 6, pp. 909-913, Jun. 2005.*

E.R. Berlekamp; "Algebraic Coding Theory"; McGraw-Hill Book Co.; pp. 176-199 and pp. 218-240; 1968.

J.L. Massay; "Shift-register Synthesis and BCH Decoding"; IEEE Transactions on Information Theory; Vo. IT-15; pp. 122-127; 1969.

* cited by examiner

FIG.7 compute $$d = s_i + \sum_{j=1}^{L} c_j s_{i-j}$$

If $d=0$, then
$C_{i-1}(x) \to C_i(x)$
$a + 1 \to a$
If $d \neq 0$, and $2L > i - 1$, then
$C_{i-1}(x) - d\, b^{-1} x^a B(x) \to C_i(x)$
$a + 1 \to a$
If $d \neq 0$, and $2L \leq i - 1$, then
$C_{i-1}(x) - d\, b^{-1} x^a B(x) \to C_i(x)$
$i - L \to L$
$C_{i-1}(x) \to B(x)$
$d \to b$
$1 \to a$

| j | n | n-1 | ... | 1 | 0 |
|---|---|---|---|---|---|
| FIRST CANDIDATES | $\alpha^2$ | $\alpha^{22}$ | ... | $\alpha^{12}$ | $\alpha^5$ |
| DECODING TARGET CANDIDATES | $\alpha^2$ | $\alpha^{22}$ | ... | $\alpha^6$ | $\alpha^5$ |

ERROR CANDIDATE TABLE 231

| No.1 | 102 | | |
|---|---|---|---|
| No.2 | 415 | 416 | |
| No.3 | 2516 | 2517 | 2518 |
| No.4 | 3010 | | |
| No.5 | 4002 | | |
| No.6 | 203 | 204 | 205 |
| No.7 | 1024 | | |
| No.8 | 3506 | 3507 | |

COMBINATION OF ERROR CANDIDATES

| No.1 | No.2 |  FLIPS NO. 1 AND NO. 2

| No.1 | No.3 |  FLIPS NO. 1 AND NO. 3

| No.2 | No.3 |  FLIPS NO. 2 AND NO. 3

⋮

| No.7 | No.8 |  FLIPS NO. 7 AND NO. 8

FIG.13

POSITION INFORMATION

| 0 | ... | 8 | 9 | ... | 22 | 23 | 24 | 25 | 26 | 27 | ... |
|---|---|---|---|---|---|---|---|---|---|---|---|
| 22.5 | ... | 0.3 | −9.6 | 10.5 | 0.4 | 22.5 | −3.5 | 0.6 | −0.6 | 9.6 | ... |

1 SECTOR

| LIKELIHOOD | POSITION INFORMATION | | | | | |
|---|---|---|---|---|---|---|
| 0.3 | 8 | | | | | |
| 0.4 | 22 | | | | | |
| 0.6 | 25 | 26 | | | | |

|  | POSITION INFORMATION | | | |
|---|---|---|---|---|
| ERROR CANDIDATE 1 | 8 | → | 0000000000100 | 01 |
| ERROR CANDIDATE 2 | 22 | → | 0000000010110 | 01 |
| ERROR CANDIDATE 3 | 25 26 | → | 0000000011001 | 10 |

FIG.18 PRIOR ART

| j | 4 | 3 | 2 | 1 | 0 |
|---|---|---|---|---|---|
| | INFORMATION STRING | | | PARITY STRING | |
| GALOIS FIELD INDICATION | 1 | $\alpha^5$ | $\alpha^4$ | $\alpha^4$ | $\alpha^4$ |
| BIT INDICATION | 001 | 110 | 101 | 101 | 101 |

FIG.19 PRIOR ART $$x^2 + \alpha^3 x + \alpha \overline{\smash{\big)}\, x^4 + \alpha^5 x^3 + \alpha^4 x^2} \quad \text{quotient: } x^2 + \alpha^2 x + \alpha^3$$

$$\text{remainder: } \alpha^4 x + \alpha^4$$

FIG.20 PRIOR ART

| j | 4 | 3 | 2 | 1 | 0 |
|---|---|---|---|---|---|
| TRANSMISSION WORD STRING: F | 1 | $\alpha^5$ | $\alpha^4$ | $\alpha^4$ | $\alpha^4$ |
| RECEIVE WORD STRING: Y | $\alpha$ | $\alpha^5$ | $\alpha^4$ | $\alpha^4$ | $\alpha^4$ |
| POSITION INFORMATION | $\alpha^4$ | $\alpha^3$ | $\alpha^2$ | $\alpha$ | 1 |

MAXIMUM LIKELIHOOD DETECTOR, ERROR CORRECTION CIRCUIT AND MEDIUM STORAGE DEVICE

CROSS-REFERENCE TO RELATED APPLICATIONS

This application is based upon and claims the benefit of priority from the prior Japanese Patent Application No. 2006-297442, filed on Nov. 1, 2006, and the prior Japanese Patent Application No. 2007-125221, filed on May 10, 2007, the entire contents of which are incorporated herein by reference.

BACKGROUND OF THE INVENTION

1. Field of the Invention

The present invention relates to a maximum likelihood detector, error correction circuit and medium storage device, and more particularly to a maximum likelihood detector, error correction circuit and medium storage device for correcting the error of data to which ECC code is attached.

2. Description of the Related Art

In the field of recording/reproducing devices, such as magnetic disk devices, and communication systems, Reed Solomon codes are used as the error correction codes (ECC). In order to improve reliability of data reproduction when reproducing data from low quality transmission signals and recording/reproducing signals, data decoding technology using maximum likelihood sequence detection and error correction technology using error correction codes (ECC) are widely used.

A bit string, which is output from the maximum likelihood detector, has an incorrect value in several bits because of the influence of medium noise and circuit noise. An ECC performs error correction for a bit string which has an error, and outputs a bit string of which error is corrected. In the case of a magnetic disk device, for example, retry is required if an ECC fails in correction, but retry must be avoided as much as possible. Therefore it has been proposed that ECC receives some candidate strings from the maximum likelihood detector, and sequentially tries to decode the candidate strings (Japanese Patent Application Laid-Open No. H11-330985, for example).

FIG. 17 is a block diagram depicting a conventional error correction circuit using the maximum likelihood sequence, and FIG. 18 to FIG. 20 are diagrams depicting the operation thereof.

As FIG. 17 shows, a maximum likelihood detector 20 creates a plurality of candidate data strings from the input signals according to a maximum likelihood sequence. A data storage section 31 stores the created plurality of candidate data strings. An ECC decoder 22 has a syndrome calculation section 41, error locator polynomial calculation section 42, chien search execution section 43 and error value calculation section 44.

The syndrome calculation section 41 calculates a syndrome calculation expression (described in FIG. 18 or later) of the data string which is input to the ECC decoder 22. The error locator polynomial calculation section 42 calculates an error locator polynomial from the syndrome polynomial (described in FIG. 18 or later). For a calculation algorithm of the error locator polynomial, a Euclidian method or Berlekamp Massey method is used, for example (see E. R. Berlekamp, "Algebraic Coding Theory", McGraw-Hill Book Co., pp. 176-199 and pp. 218-240, New York, 1968, and J. L. Massey, "Shift-register Synthesis and BCH Decoding", IEEE Transactions on Information Theory, Vol. IT-15, pp. 122-127, 1969, for example).

The chien search execution section 43 executes chien search using the above mentioned error locator polynomial, and determines a position on the data string where error exists (error position). The error value calculation section 44 corrects the erred value on the error position to a correct value. Then the decoding judgment section 32 checks the validity of the data string after correction, which is output from the error value calculation section 44, and if not valid, the decoding judgment section 32 judges this as a correction failure, and instructs the data storage section 31 to output the next decoding candidate data string.

Error correction based on the Reed Solomon codes will now be described more specifically with reference to FIG. 18 to FIG. 20. As FIG. 18 shows, the Reed Solomon codes with the number of error corrections 't' is generated by a generating polynomial of degree 2t. If the Galois field used for encoding is GF (third power of 2), and if the number of error corrections 't' is "1", then the generating polynomial of a Reed Solomon code is expressed by the following Expression (1), for example, using primitive element $\alpha$.

[Expression 1]

$$G(x) = (x-1)(x-\alpha) \qquad (1)$$
$$= x^2 + \alpha^3 x + \alpha$$

In this case, starting with $\alpha^0=1$, three bits of a bit string is handled as one symbol, and a parity string with symbol 2t (=2) is added to an information string in ECC encoding. For example, in order to encode an information string in FIG. 18, "001", "110" and "101" correspond to 1, the fifth power of $\alpha$ and the fourth power of $\alpha$ in the Galois field notation. The j-th symbol is a coefficient of the term $x^j$ in the polynomial of a transmission word string. Therefore the bit string (information string) indicates a polynomial $x^4+\alpha^5 x^3+\alpha^4 x^2$.

As FIG. 19 shows, in ECC encoding, the polynomial representing the bit string is divided by the generating polynomial in Expression (1), and the parity string representing the acquired remainder polynomial $\alpha^4 x+\alpha^4$ is added to the bit string. In this remainder polynomial, the coefficients of the terms of degree 1 and degree 0 of x are both $\alpha^4$, so a parity string shown in FIG. 18 is added, and a transmission word string consisting of 5 symbols is generated.

If this transmission word string is recorded in a magnetic disk and read, for example, a receive word string, including an error as shown in FIG. 20, could be input to the ECC decoder 22. This receive word string is given by the following Expression (2).

[Expression 2]

$$Y(x)=\alpha x^4+\alpha^5 x^3+\alpha^4 x^2+\alpha^4 x+\alpha^4 \qquad (2)$$

For this receive word string in FIG. 20, the syndrome calculation section 41 calculates the syndrome polynomial by the following Expression (3).

[Expression 3]

$$S(x)=s_1+s_2 x$$
$$s_1=Y(1)$$
$$s_2=Y(\alpha) \qquad (3)$$

In Expression (3), the syndrome si (i=1, 2, ..., 2t) is a value obtained by substituting the i-th root of the generating polynomial G (x) in Expression (1) for the receive word polynomial Y (x), and the syndrome polynomial S (x) is a polynomial in which the syndrome si is a coefficient of the term $x^{i-1}$. If an error is not included in the receive word string, all si becomes "0".

Then the error locator polynomial calculation section 42 calculates the error locator polynomial C (x) of the following Expression (4) using the syndrome polynomial S (x).

[Expression 4]

$$C(x)=1+\alpha^{-4}x \quad (4)$$

Then the chien search execution section 43 calculates the value of C ($\alpha^j$) (j=0, 1, 2, 3, 4) using the error locator polynomial C (x) in Expression (4), and outputs position j where C ($\alpha^j$)=0 as the error position. In the case of the example in FIG. 20, C ($\alpha^4$)=1+$\alpha^{-4}\cdot\alpha^4$=0, so the error existing in the fourth symbol can be detected.

Then the error value calculation section 44 calculates a correct value of the fourth symbol by a predetermined algorithm using the syndrome polynomial S (x) of Expression (3) and the error locator polynomial C (x) of Expression (4), and corrects the bit string. In this example, a correct value "1" is determined, and the fourth symbol in the receive word string shown in FIG. 20 is corrected from α to "1".

In the case of a magnetic disk device, for example, a Reed Solomon code, of which number of error corrections t=20, is used, and in ECC error encoding, one symbol consists of 10 bits, and a parity string with 40 symbols is inserted in front of one sector of the bit string (4096 bits=410 symbols). In this case, the syndrome polynomial S (x) and the error locator polynomial C (x) are given by the following Expressions (5) and (6), for example.

[Expression 5]

$$S(x)=s_1+s_2x+\ldots+s_{40}x^{39} \quad (5)$$

[Expression 6]

$$C(x)=1+x+\alpha^2x^2+\ldots+\alpha^{35}x^8 \quad (6)$$

An actual receive word string is long, so the degree of the receive word polynomial Y (x) becomes large. In prior art, it is necessary to receive a plurality of candidate data strings and to sequentially try to decode candidate data strings by ECC. If the creation of a candidate data string of a maximum likelihood detector is inappropriate, ECC decoding could fail for all candidate data strings, and correction performance cannot be improved.

If a maximum likelihood detector is provided for all the candidates, the sequence of the candidates must be sorted and transferred to the ECC decoder in the sequence of lower likelihood, so the calculation volume for creating candidate data strings increases, and the circuit scale increases.

SUMMARY OF THE INVENTION

With the foregoing in view, it is an object of the present invention to provide a maximum likelihood detector, error correction circuit and medium storage device for providing an appropriate candidate data string to an ECC decoder, and improving the correction performance.

It is another object of the present invention to provide a maximum likelihood detector, error correction circuit and maximum storage device for providing an appropriate candidate data string to an ECC decoder, even with small calculation volume, and improving the correction performance.

It is still another object of the present invention to provide a maximum likelihood detector, error correction circuit and medium storage device for providing an appropriate candidate data string to an ECC decoder, even if the circuit scale is small, and improving the correction performance.

To achieve these objects, a maximum likelihood detector of the present invention has a detector for creating a decoding target data string from input signals, and detecting a likelihood of each bit of the decoding target data string, and an error candidate extractor for receiving the likelihood of each bit and creating an error candidate table for storing the bit position information of the arbitrary number of the bits which likelihood is a predetermined threshold or less as the selected error candidates.

An error correction circuit of the present invention has a detector for creating a decoding target data string from input signals, and detecting a likelihood of each bit of the decoding target data string, an error candidate extractor for receiving the likelihood of each bit and creating an error candidate table for storing the bit position information of the arbitrary number of the bits of which likelihood is a predetermined threshold or less as the selected error candidates in the sequence of the likelihood, and a correction circuit for correcting an error of the decoding target data string and outputting the same. And when judging that the correction has failed, the correction circuit extracts the error candidates from the error candidate table, and creates a new decoding target data string.

A medium storage device of the present invention has a head for reading signals from a storage medium, a detector for creating a decoding target data string from the read signals of the head, and detecting a likelihood of each bit of the decoding target data string, an error candidate extractor for receiving the likelihood of each bit and creating an error candidate table for storing the bit position information of the arbitrary number of the bits of which likelihood is a predetermined threshold or less as the selected error candidates in the sequence of the likelihood, and a correction circuit for correcting an error of the decoding target data string and outputting the same, wherein when judging that the correction has failed, the correction circuit extracts the error candidates from the error candidate table, and creates a new decoding target data string.

In the present invention, it is preferable that the error candidate extractor has a threshold judgment section for comparing the likelihood of each bit of the decoding target data string and a predetermined threshold, and extracting bit positions of which likelihood is a predetermined threshold or less, and a higher candidate selection section for creating the error candidate table for storing the extracted bit positions as the selected error candidates.

In the present invention, it is also preferable that the threshold judgment section stores the extracted bit positions of which likelihood is a predetermined threshold or less into a stack table as the likelihood and the bit position according to a plurality of likelihood levels.

In the present invention, it is also preferable that the higher candidate selection section refers to the stack table for each likelihood level, and stores the bit positions of the selected error candidates.

In the present invention, it is also preferable that the higher candidate selection section stores bit positions, of which absolute values of the likelihood are the same, into the error candidate table as one selected error candidate.

In the present invention, it is also preferable that the higher candidate selection section refers to the stack table for each likelihood level, stores bit positions, of which the likelihood level is relatively low in the stack table, into the error candidate table, sorts the bit positions of which likelihood level is relatively high in the stack table, and stores the sorted bit positions in the error candidate table.

In the present invention, it is also preferable that the error candidate extractor detects that the bits of which likelihood is a threshold or less continue for a predetermined number of bits, and disables storing the continuous bit positions into the table.

In the present invention, it is also preferable that the error candidate extractor creates the table in a form of a start position and an error length of the error candidate as the bit position.

In the present invention, it is also preferable that the correction circuit has a syndrome calculation section for calculating a set of syndromes from the decoding target data string, an error locator polynomial calculation section for calculating coefficients of an error locator polynomial from the set of syndromes, judging whether correction succeeded or not using the coefficients of the error locator polynomial, and requesting the error candidate to the error candidate table when the judgment result is a correction failure, and a correction circuit for correcting an error of the decoding target data string using the syndromes and the coefficients of the error locator polynomial according to the judgment result on success of correction of the error locator polynomial calculation section.

In the present invention, it is also preferable that the correction circuit has a syndrome holding section for holding the calculated syndromes, and a syndrome update section for calculating a difference of syndromes from the difference between a decoding target data string and a new decoding target data string, and updating the held syndromes with the difference.

Since bit positions, of which error probability is high, are extracted based on the likelihood of each bit as error candidates of the decoding target data string, error candidates which can be effectively corrected can be provided to the correction circuit. Also only bit positions, of which error probability is high, are extracted as error candidates, so the number of times of sorting bit positions in the sequence of likelihood, for the correction circuit to extract error candidates in the sequence of lower likelihood, can be decreased, and therefore the calculation volume can be effectively decreased.

BRIEF DESCRIPTION OF THE DRAWINGS

FIG. 7 shows a calculation algorithm of the error locator polynomial in FIG. 6.

FIG. 13 is a diagram depicting an operation of the stack table in FIG. 12.

FIG. 18 is a diagram depicting the encoding operation for error correction according to a prior art.

FIG. 19 shows the parity string generation operation in FIG. 18.

FIG. 20 is a diagram depicting an error correction operation according to a prior art.

DESCRIPTION OF THE PREFERRED EMBODIMENTS

Embodiments of the present invention will now be described in the sequence of the recording/reproducing system, error candidate extractor, ECC decoder, another error candidate extractor and other embodiments, but the present invention is not limited to these embodiments.

Recording/Reproducing System

Figure 1:
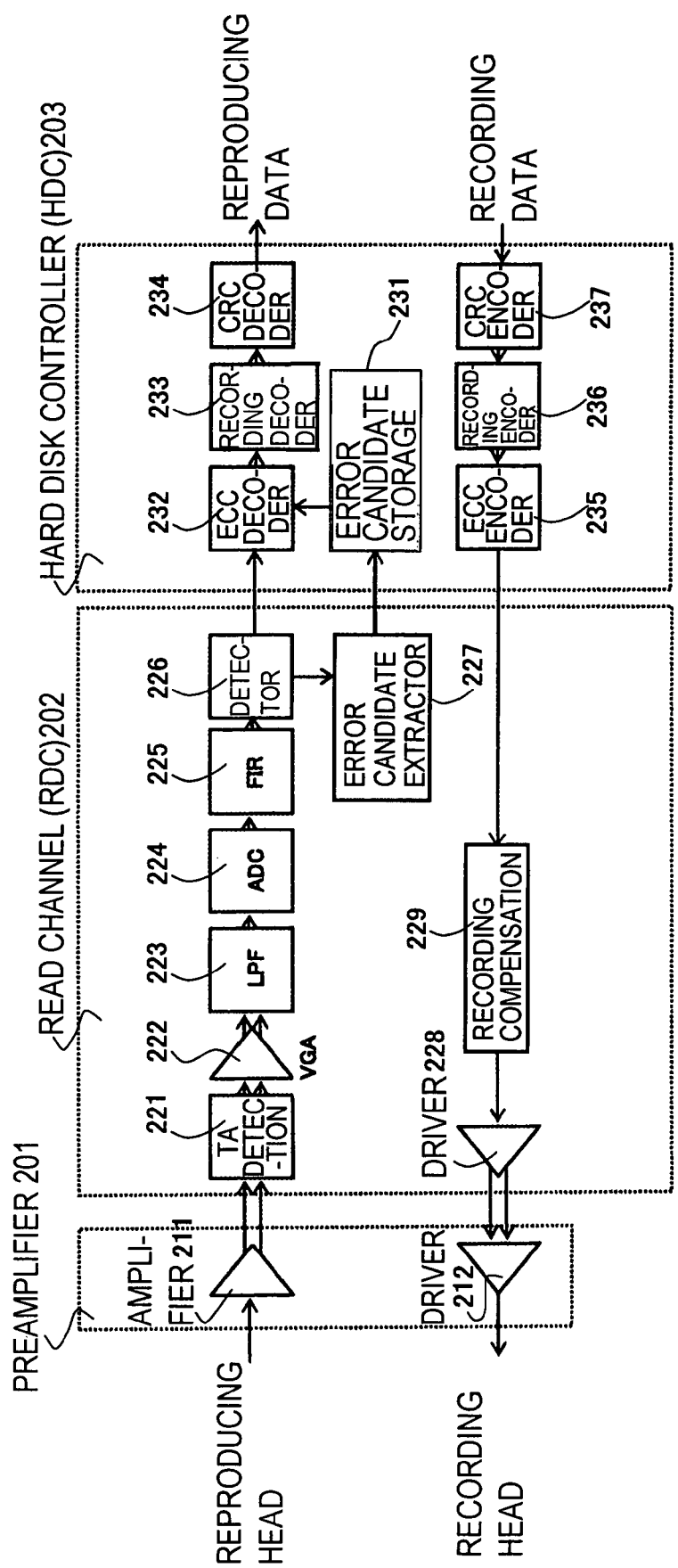
FIG. 1 is a block diagram depicting a recording/reproducing system of a medium storage device according to an embodiment of the present invention.

FIG. 1 is a block diagram depicting a recording/reproducing system of a magnetic disk device according to an embodiment of the present invention. As FIG. 1 shows, the recording/reproducing system of the magnetic disk device is comprised of a hard disk controller (HDC) 203, a read channel (RDC) 202 and a preamplifier (or head IC) 201.

For recording, a CRC (Cyclic Redundancy Code) encoder 237 adds a CRC code to a recording data in the HDC 203. Then a recording encoder 236 converts the recording data into a data string where such constraints as MTR (Maximum Transition Run) code and RLL (Run Length Limited) code are satisfied. And an ECC encoder 235 adds a parity string according to the above mentioned Expression (1).

The ECC-encoded data string is input to the RDC 202. A recording compensator 229 in the RDC 202 performs compensation processing for slightly spreading the reversal interval at a location where the reversal of magnetization occurs next to each other. And a driver 228 in the RDC 202 outputs the recording-compensated data string to the preamplifier 201. In the preamplifier 201, a driver 212 generates a write current for a recording head (write head), which is not illustrated, and drives the recording head, and records data onto a magnetic disk, which is not illustrated.

In the case of reproducing, on the other hand, an amplifier 211 of the preamplifier 201 amplifies analog voltage from a reproducing head (read head), then outputs it to the RDC 202. A thermal asperity detection processing section 221 of the RDC 202 performs thermal asperity processing, then a variable gain amplifier (VGA) 222 adjusts the amplitude.

Then a low pass filter (LPF) 223 cuts a high frequency band of the amplitude-adjusted read signals, and an A/D converter (ADC) 224 converts the analog output thereof into digital signals. Then an FIR (Finite Impulse Response) filter 225 performs waveform equalization on the digital signals, and inputs the result into a maximum likelihood detector 226.

The maximum likelihood detector 226 is such maximum likelihood detectors as SOVA (Soft Output Viterbi), NPSOVA (Noise Predictive Soft Output Viterbi) or BCJR (Bahl, Cocke, Jelinek and Raviv algorithm), and performs maximum likelihood decoding.

The decoding string is sent from the maximum likelihood detector 226 to the HDC 203. At this time, an error candidate extractor 227 extracts the bit string candidates which have a high error probability in the maximum likelihood decoding, and sends them to an error candidate storage 231 of the HDC 203. The error candidate storage 231 of the HDC 203 stores the bit string candidates which have a high error probability.

The decoding string sent from the maximum likelihood detector 226 is error-corrected by an ECC decoder 232. If decoding succeeds, a recording decoder 233 performs decoding, in reverse processing of the encoding of the recording encoder 236, and a CRC decoder 234 performs CRC decoding and outputs the result as the reproducing data.

If the decoding by the ECC decoder 232 fails, the ECC decoder 232 selects several bit strings which have a high error probability in the error candidate storage 231, and creates a decoded string flipping each value in a bit string from "0" to "1" or "1" to "0". And the ECC decoder 232 corrects errors again.

If the decoding succeeds, the result is output as the reproducing data via the recording decoder 233 and the CRC decoder 234, as mentioned above. If decoding fails, on the other hand, the ECC decoder 232 selects several different bit strings which have a high error probability from the error candidate storage 231, and creates a decoded string flipping each value of the bit string, and corrects the errors.

Since the ECC decoder 232 must repeat error correction a few times, a high-speed judgment ECC circuit, which will be described in FIG. 5 and later, is used. By this, the calculation volume can be decreased.

Here, according to the present invention, the error candidate extractor 227 receives the position of each bit of a decoded string detected in the maximum likelihood detection and the likelihood of each bit position from the maximum likelihood detector 226, and extracts the bit positions of which likelihood is low (that is, have a high error probability) as error candidates, and stores them in the error candidate storage 231.

In other words, bit positions of which error probability is high are extracted as error candidates, so error candidates which can be effectively corrected can be provided to the ECC decoder 232. Also only bit positions of which error probability is high are extracted as error candidates, so the number of times of sorting bit positions in the sequence of the likelihood, for the ECC decoder 232 to extract error candidates, can be decreased, and therefore the calculation volume can be effectively decreased.

Error Candidate Extractor

Figure 2:
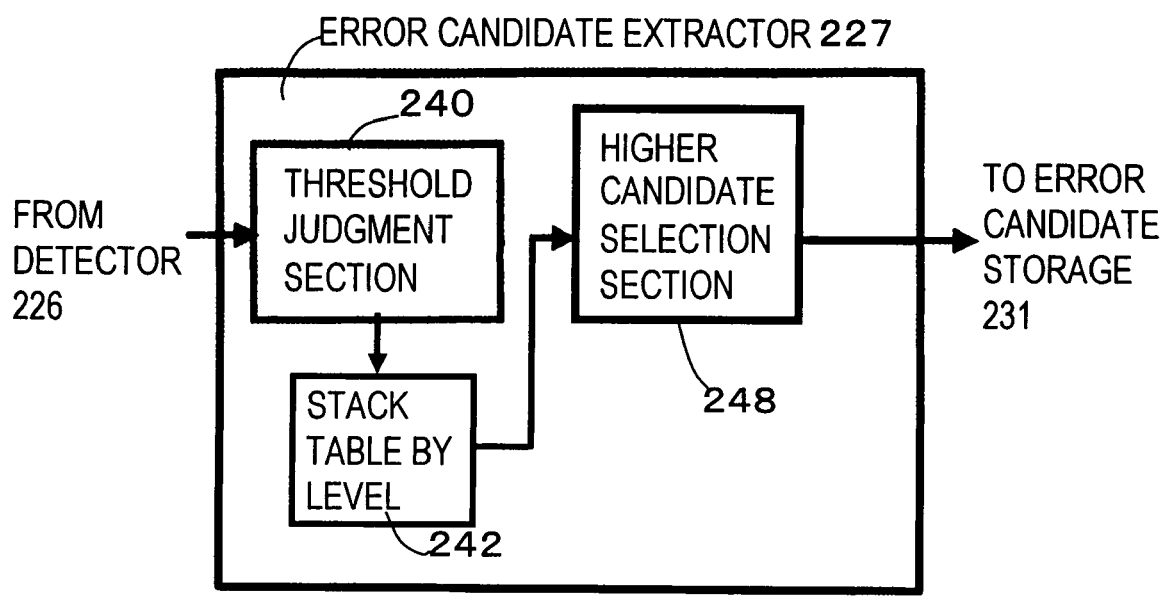
FIG. 2 is a block diagram depicting the error candidate extractor in FIG. 1.

Now a configuration of the error candidate extractor 227 in FIG. 1 will be described. FIG. 2 is a block diagram depicting the error candidate extractor 227 in FIG. 1, FIG. 3 is a diagram depicting an operation of the threshold judgment section in FIG. 2, and FIG. 4 is a diagram depicting the operation of the threshold judgment section and the higher candidate selection section in FIG. 2.

As FIG. 2 shows, the error candidate extractor 227 is comprised of a threshold judgment section 240, a stack table by level 242 and a higher candidate selection section 248. The detector 226, such as an SOVA, NSOVA or BCJR, calculates the likelihood of each bit of a data string (sector), as shown in FIG. 3. As the likelihood is higher, the probability that the bit has no error is higher, and as the likelihood is lower, the probability that the bit has an error is higher.

In order to store bits having a high error probability in the table 242, only bits having low likelihood are handled. For this, the threshold judgment section 240 sets a threshold, and stores only bits (bit positions) having a likelihood which is a threshold or less in the table 242.

Figure 3:
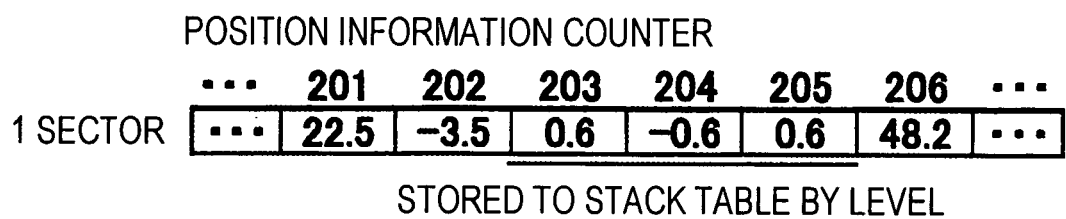
FIG. 3 is a diagram depicting the threshold judgment section in FIG. 2.
Figure 4:
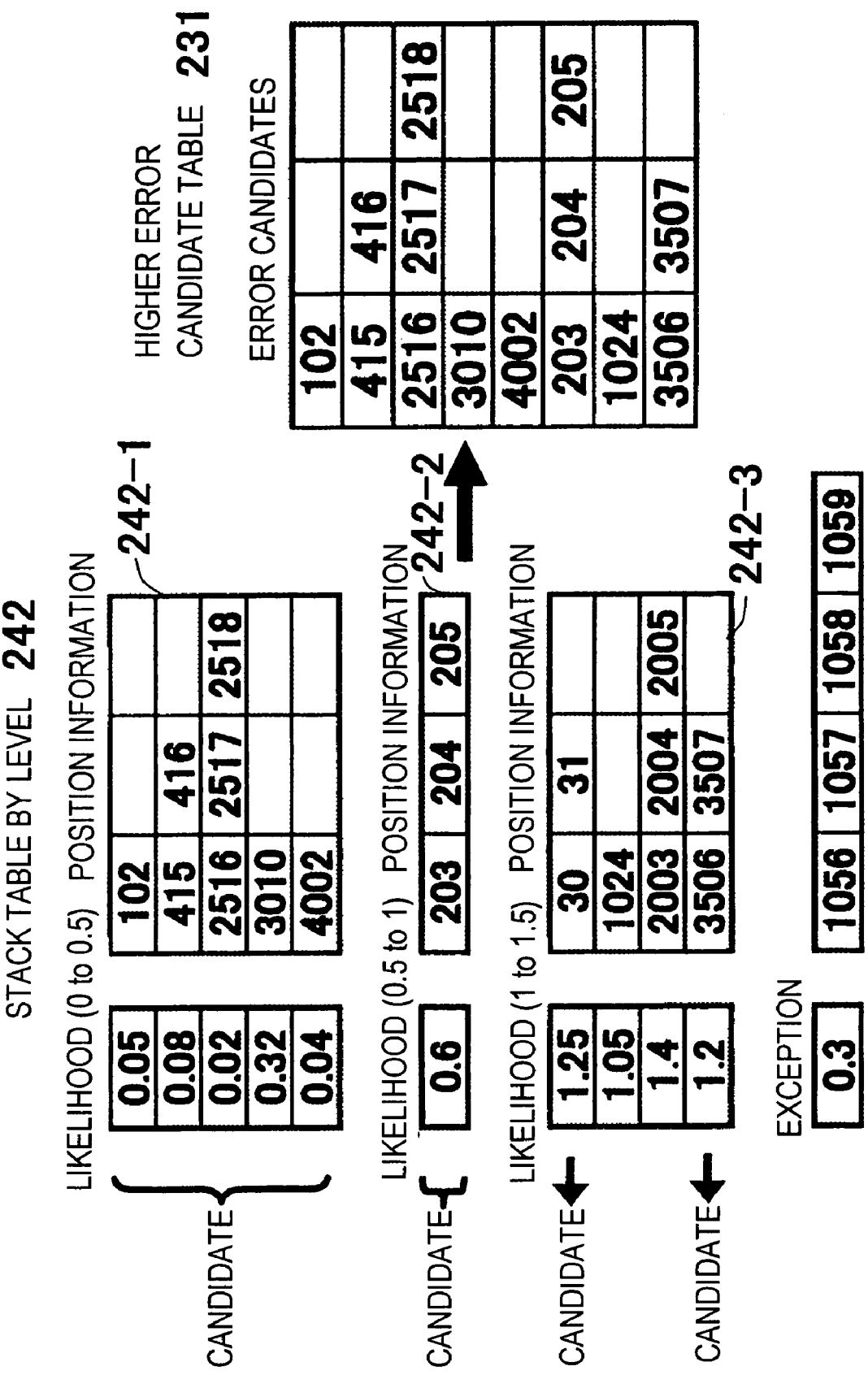
FIG. 4 is a diagram depicting the operation of the higher candidate selection section in FIG. 1.

In FIG. 3, value '1.5' is set as the threshold, and the bit positions of which likelihood value is in the '−1.5' to '+1.5' range are extracted and stored in the table 242. In FIG. 3, the likelihood values of the $203^{rd}$, $204^{th}$ and $205^{th}$ bit of one sector are in the '−1.5' to '+1.5' range, so the bit positions (203, 204, 205) are stored in the table 242. The threshold is determined according to the range of the assumed SNR (Signal-to-Noise Ratio) and the memory size of the table 242.

In the stack table 242, the stored bit positions and the likelihood values are divided into a few likelihood value ranges (levels), as shown in FIG. 4. In FIG. 4, the absolute values of the likelihood values are divided into three ranges, '0' to '0.5', '0.5' to '1.0' and '1.0' to '1.5', and each range is denoted with 242-1, 242-2 and 242-3 respectively in the stack table 242.

For example, the absolute values of the likelihood of the $203^{rd}$, $204^{th}$ and $205^{th}$ bits in FIG. 3 are "0.6", so as FIG. 4 shows, the position information and the absolute values of the likelihood values are stored in table 242-2 for the range '0.5' to '1.0'.

Also as FIG. 4 shows, a continuous bit string of which absolute values of the likelihood are the same are stored in a same row, and this bit string is regarded as one error candidate. For example, the $203^{rd}$, $204^{th}$ and $205^{th}$ bits, shown in FIG. 3, become one error candidate. As shown in FIG. 4, in order to make the absolute values of the likelihood the same, an equalization target (parameter of linear equalization), which becomes symmetric, such as PR (Partial Response) −4, can be used.

If MTR code for suppressing a continuous error is used for the recording code, the table memory can be saved by limiting the number of columns of the table 242. For example, 16/17 MTR code is for encoding 16-bit data to 17-bit data, and the generation of a 4-bit or longer continuous error can be prevented.

Therefore, as shown in FIG. 4, even if a string of 4 continuous bits having a likelihood of which absolute value is low, "0.3", exists, a 4-bit continuous error is not generated according to the encoding principle, so this bit string is not regarded as an error candidate, but is ignored. In other words, the threshold judgment section 240 extracts bits of which likelihood is a threshold or less, and judges whether the bits of which likelihood is a threshold or less continue for 4 bits or not, and if they are 4 continuous bits, then the 4 continuous bits are ignored, and are not stored in the stack table 242.

If this encoding principle is used, a correction mistake is prevented, and correction capability improves. Error candidates are bits which continue for 3 bits or less, so the number of columns of the position information table of the stack table 242 can be decreased to three or less, and memory can be conserved.

Then the higher candidate selection section 248 selects several candidates with lower likelihood out of the error candidates stored in the stack table 242, and outputs them to the error candidate storage 231 as higher error candidates. The error candidate storage 231 stores the higher error candidates, which were output from the higher candidate selection section 248, into the higher error candidate table.

In the example in FIG. 4, the higher eight error candidates are selected from the stack table 242, and are stored in the higher error candidate table 231. In order to select the higher eight error candidates from the stack table 242, it is necessary to confirm how many candidates are stored in each level of the table.

In FIG. 4, there are five candidates in the range where the absolute values of likelihood are in the '0' to '0.5' range. In the range where the absolute values of likelihood are '0.5' to '1.0', there is one candidate, and in the range where the absolute values of likelihood are '1.0' to '1.5', there are four candidates.

In order to select eight error candidates, all the candidates in the '0' to '0.5' range, all the candidates in the '0.5' to '1.0' range, and the two candidates with lower likelihood out of the four candidates in the '1' to '1.5' range are selected.

In order to select two candidates with lower likelihood out of the four candidates in the '1' to '1.5' range, sorting is required, but sorting need not be performed in all the likelihood level ranges, but can be performed only for the likelihood level in the '1' to '1.5' range. This has an effect of decreasing the calculation volume. Also the sorting circuit can be simplified.

Likelihood values are not required in the error candidate data in the error candidate storage 231, and bit positions thereof are stored in the sequence of lower likelihood. This can also save memory capacity. In this way, dividing the table into appropriate levels is effective to decrease the calculation volume, such as decreasing the number of times of sorting.

Using such higher error candidates of the error candidate storage 231, the ECC decoder 232, which is described below, corrects errors efficiently.

ECC Decoder

Figure 5:
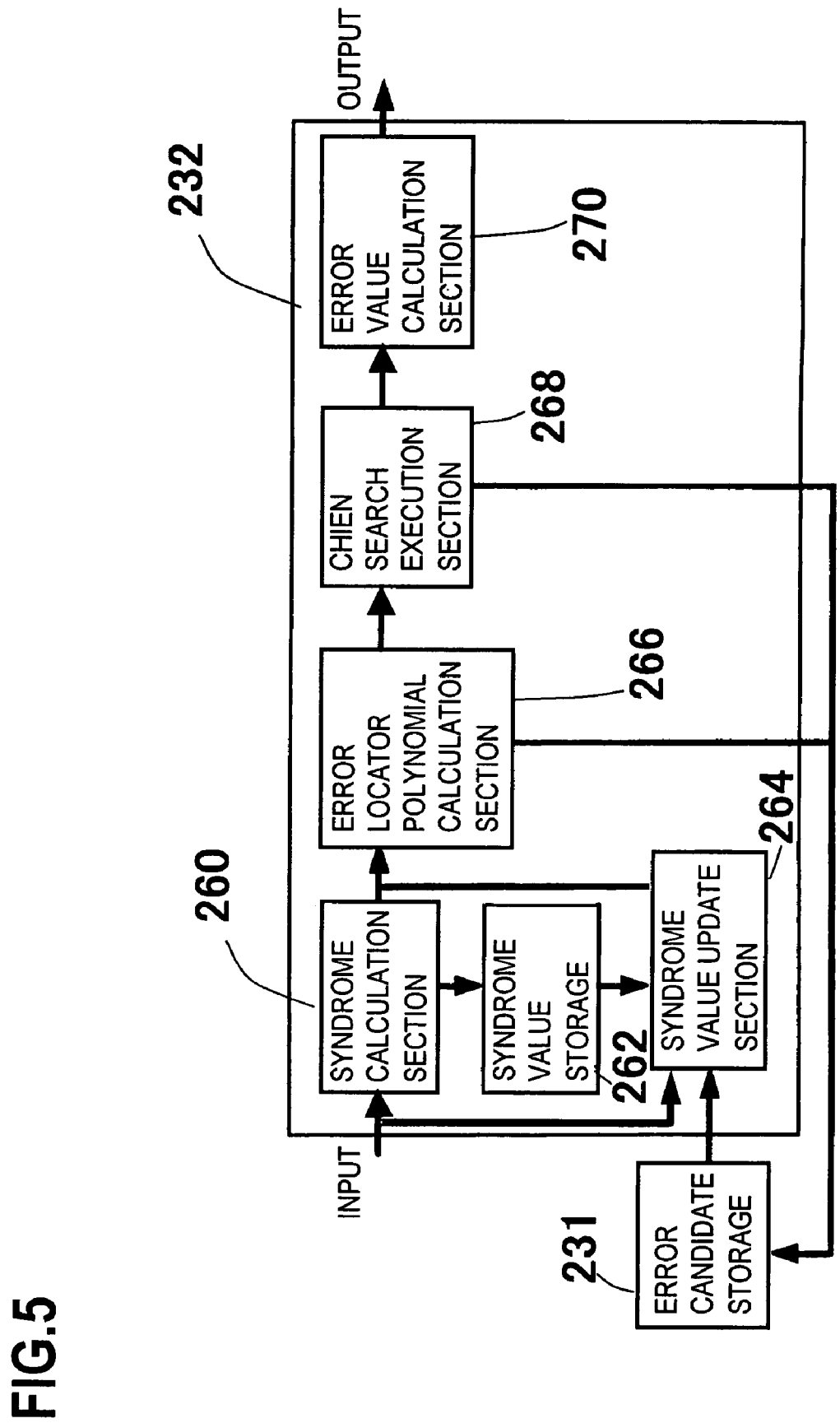
FIG. 5 is a block diagram depicting the ECC decoder in FIG. 1.
Figure 6:
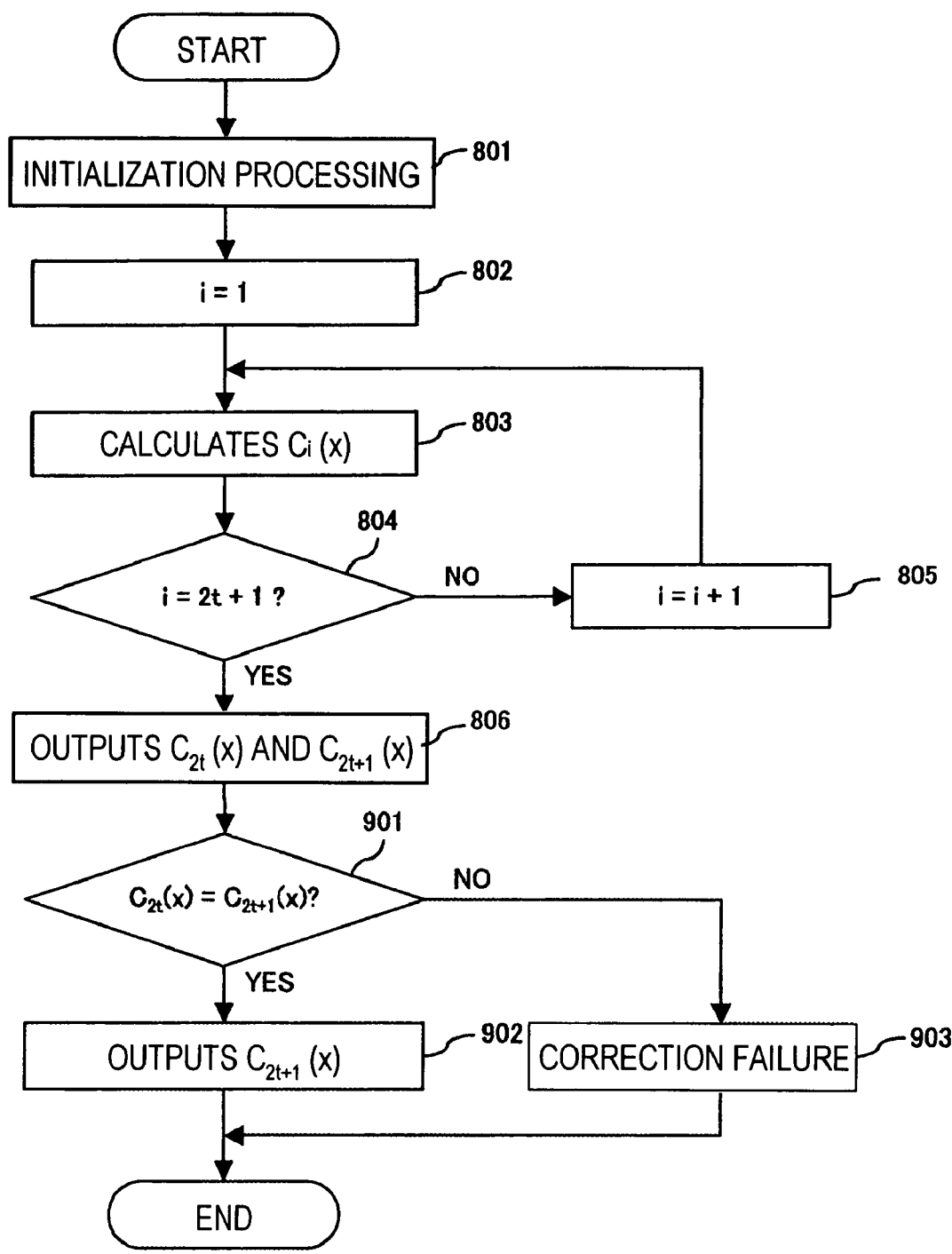
FIG. 6 is a flow chart depicting the processing of the error locator polynomial calculation section in FIG. 5.
Figure 8:
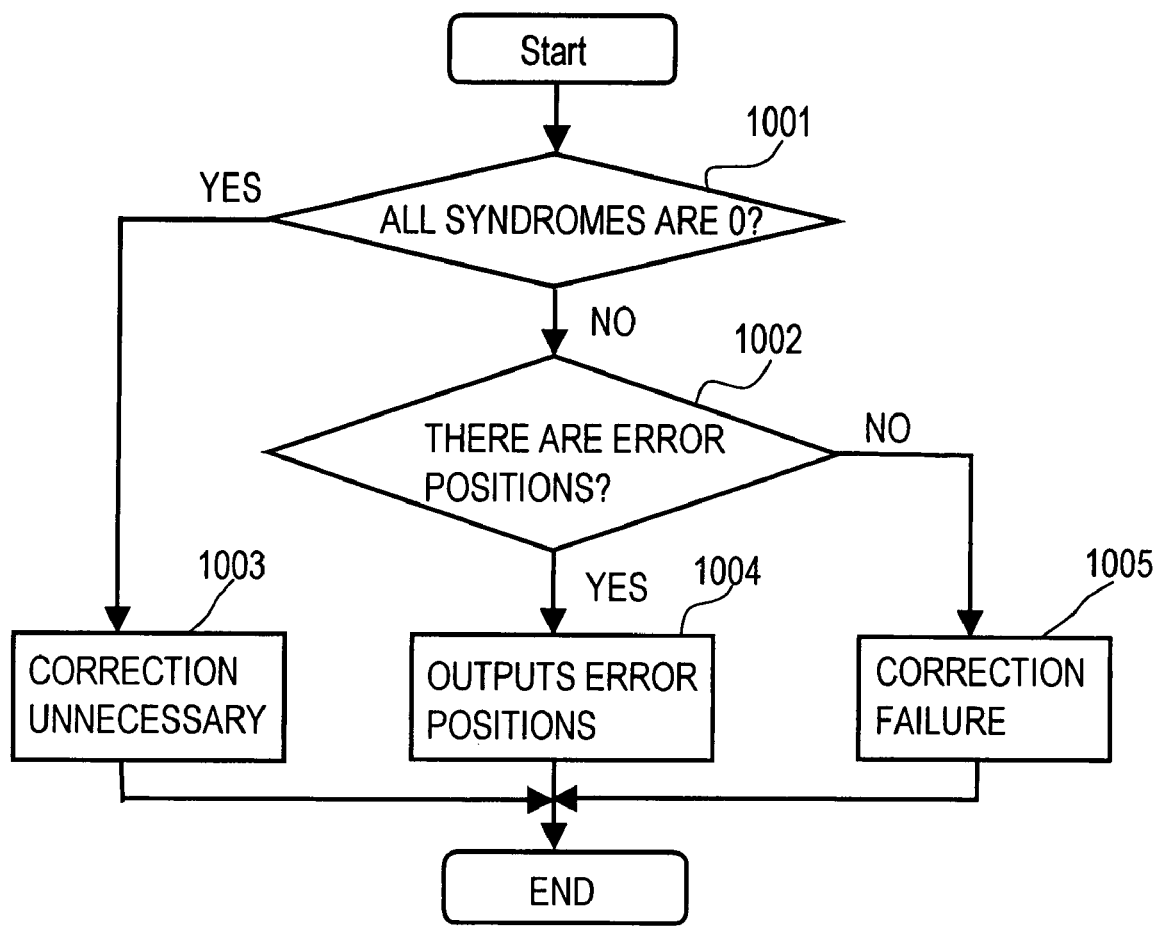
FIG. 8 is a flow chart depicting the processing of the chien search execution section in FIG. 5.
Figures 9, 10:
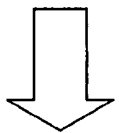
FIG. 9 is a diagram depicting candidates.
FIG. 10 is a diagram depicting the combination of error candidates.
Figure 11:
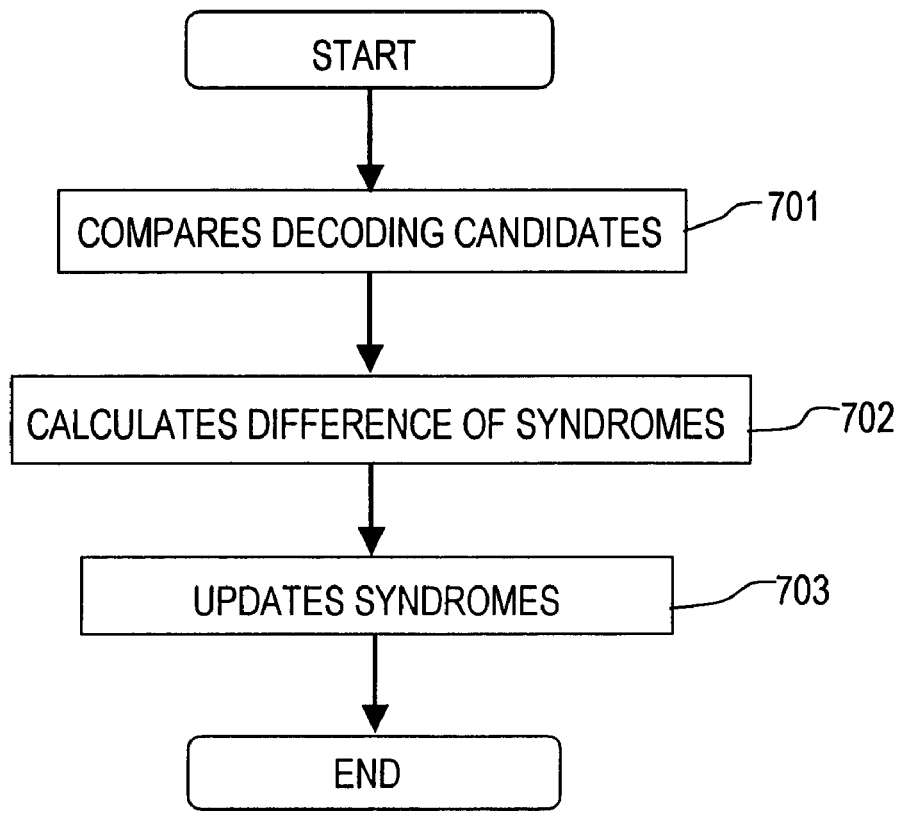
FIG. 11 is a flow chart depicting the processing of the syndrome update section in FIG. 5.

FIG. 5 is a block diagram depicting the ECC decoder in FIG. 1, FIG. 6 is a flow chart depicting the processing of the error locator polynomial calculation section in FIG. 5, FIG. 7 is a diagram depicting an arithmetic algorism of the error locator polynomial in FIG. 6, FIG. 8 is a flow chart depicting the processing of the chien search execution section in FIG. 5, FIG. 9 is a diagram depicting a decoding candidate, FIG. 10 is a diagram depicting the flip operation in FIG. 5, and FIG. 11 is a flow chart depicting the processing of the syndrome update section in FIG. 5.

As FIG. 5 shows, the ECC decoder 232 is comprised of a syndrome calculation section 260, syndrome storage section 262, error locator polynomial creation section 266, chien search execution section 268, and error value calculation section 270.

The syndrome value calculation section 260 calculates the syndrome of a decoded string from the detector 226, and stores the calculated syndrome value in the syndrome value storage section 262. The error locator polynomial creation section 266 calculates an error locator polynomial using the created syndrome polynomial, and judges whether the result exceeds the correction capability.

If the error locator polynomial creation section 266 or the chien search execution section 268 judges that the decoding failed, a syndrome value update section 264 selects several error candidates from the error candidate storage 231, and flips the corresponding locations, and updates the syndrome values of the flipped bit strings based on the flipped locations and the syndrome values stored in the syndrome value storage 262.

If the error locator polynomial creation section 266 judges that decoding did not fail, the chien search execution section 268 determines an error position by chien search. If decoding is not judged as failure in a chien search, that is if the error position is specified in a chien search, the error value calculation section 270 calculates an error value.

In this way previous syndrome values are stored, and when decoding fails, error candidates are extracted, a bit string in that position of the decoded string is flipped, the syndrome values of the flipped bit string are calculated, and the previous syndrome values are updated. Since it is not necessary to calculate syndrome values from scratch for a flipped bit sting, the calculation volume can be decreased.

As mentioned later, decoding failure can be judged in the stage of calculating an error locator polynomial, so if decoding fails, the next error candidates can be tried to decoding, and the calculation volume can be decreased.

Now the ECC decoder 232 will be described in detail using FIG. 6 to FIG. 11. First ECC encoding will be described. Generally a generating polynomial of Reed Solomon code, of which number of error corrections is 't', is given by the following Expression (7). Unlike Expression (1), Expression (7) starts with $\alpha$.

[Expression 7]

$$G(x)=(x-\alpha)(x-\alpha^2)\ldots(x-\alpha^{2t}) \quad (7)$$

Therefore in the case of the number of error corrections t=20, the generating polynomial of degree 40, as shown in the following Expression (8), is used.

[Expression 8]

$$G(x)=(x-\alpha)(x-\alpha^2)\ldots(x-\alpha^{40}) \quad (8)$$

Whereas according to the present embodiment, the degree of the gene rating polynomial is increased in order for the error locator polynomial calculation section 266 to judge success/failure of decoding at an early stage, and the generating polynomial of degree 41, as shown in the following Expression (9), is used.

[Expression 9]

$$G(x)=(x-\alpha)(x-\alpha^2)\ldots(x-\alpha^{40})(x-\alpha^{41}) \quad (9)$$

In other words, a parity string with 41 symbols is generated for ECC encoding, and is inserted before one sector of a bit string (410 symbols).

The syndrome calculation section 260 of the ECC decoder 232 calculates the syndrome polynomial (coefficients of polynomial s1, s2, . . . ) of the data string according to Expression (3) and outputs the calculated syndrome polynomial to the error locator polynomial calculation section 266. At this time, the values of 2t+1 number of syndrome coefficient si (i=1, 2, . . . , 2t, 2t+1) are calculated. At the same time, the syndrome calculation section 260 stores the calculated syndrome polynomial to the syndrome storage section 262 to use these values for decoding processing of the second or later candidates.

The error locator polynomial calculation section 266 calculates the syndrome polynomial using the Berlekamp Massey method. According to the Berlekamp Massey method, an error locator polynomial is calculated by starting with an initial value of the polynomial, and repeating the update of the polynomial for the same number of times as the degree of the generating polynomial. In order to determine the i-th polynomial Ci (x) in this case, the value of the i-th syndrome si is required.

The error locator polynomial calculation section 266 generates the 2t-th polynomial C2t (x) and (2t+1)-th polynomial C2t+1 (x). And the error locator polynomial calculation section 504 compares the coefficients of the 2t-th polynomial C2t (x) and the (2t+1)-th polynomial C2t+1 (x), and judges whether the two polynomials match.

According to the Berlekamp Massey method, if the number of errors included in the data string is k (k≦t), the polynomial is not updated in the (2k+1)th or later repeat, where the C2k (x) or later polynomials all become the same. Therefore if C2t (x) and C2t+1 (x) match, the number of errors is t at most, which is within a range of error correction capability. If C2t (x) and C2t+1 (x) do not match, on the other hand, the number of errors exceeds the error correction capability.

Therefore if C2t (x) and C2t+1 (x) match, the error locator polynomial calculation section 266 judges that correction of this candidate succeeded, and outputs the data string, syndrome polynomial, error locator polynomial and judgment result to the chien search execution section 268. If C2t (x) and C2t+1 (x) do not match, the error locator polynomial calculation section 266 judges that correction of the candidate failed, and instructs the data storage section 231 to output the next decoding candidate.

In this way, a correction failure of a data string can be detected in the middle of decoding by adding an extra parity with one symbol to the data string, and calculating one extra polynomial based on the Berlekamp Massey method. A format of adding an extra parity with several symbols may also be used.

This processing will be described with reference to FIG. 6 and FIG. 7.

(S801) The error locator polynomial calculation section 266 first performs initialization processing, and initializes a polynomial C0 (x), polynomial B (x), and integers 'a' and 'b' to "1", and L to "0".

(S802) Then the control variable 'i', which indicates the number of times of repeat, is set to "1".

(S803) Using the value of the syndrome si, the coefficients of the i-th polynomial Ci (x) are determined from the coefficients of the (i−1)th polynomial Ci−1 (x) according to the Berlekamp Massey method. Here the coefficients of the term of degree j of the polynomial Ci−1 (x) are assumed as Cj (j=1, 2, . . . L) and the coefficients of the polynomial Ci (x) are determined according to the calculation algorithm shown in FIG. 7.

(S804) Then the control variable i and the degree 2t+1 of the generating polynomial are compared.

(S805) If i<2t+1, i is updated to (i+1), and processing returns to step S803.

(S806) If i=2t+1, the coefficients of the polynomial C2t (x) and C2t+1 (x) are output.

(S901) Then each coefficient of the polynomial C2t (x) and each coefficient of the polynomial C2t+1 (x) are compared.

(S902) If all the coefficients match respectively, it is judged as correctable, and the coefficients of the polynomial C2t+1 (x) is output to the chien search execution section 268 as the coefficients of the error locator polynomial.

(S903) If any coefficients do not match, it is judged as a correction failure, and the error locator polynomial calculation section 266 requests the data storage section 231 to send the next candidate.

Then the chien search execution section 268 executes a chien search using the error locator polynomial C (x), and calculates the value of C ($\alpha^j$) (j=0, 1, 2, 3, 4, . . . , n) for all positions j on the data string. Here n+1 refers to the code length (symbol). Position j at C ($\alpha^j$)=0 is an error position.

Then the chien search execution section 268 judges success/failure of correction using the syndrome polynomial and value C ($\alpha^j$), and if it is judged that correction succeeded, the chien search execution section 268 outputs the received data string, syndrome polynomial and error locator polynomial to the error value calculation section 270. If it is judged that correction failed, the chien search execution section 268 requests the data storage section 231 to send the next candidate.

FIG. 8 is a flow chart depicting the judgment processing of the chien search execution section 268.

(S1001) First the values of the syndrome polynomial si (i=1, 2, . . . , 2t, 2t+1) are checked.

(S1002) If any of the syndromes si are not "0", the values of C ($\alpha^j$) (j=0, 1, 2, 3, 4, . . . n) are checked.

(S1003) If all the syndromes si are "0" in step S1001, the chien search execution section judges that correction is unnecessary, and outputs the judgment result to the error value calculation section 270.

(S1004) If any of the values of C ($\alpha^j$) become "0" in step S1002, the chien search execution section 268 outputs the position j to the error value calculation section 270 as an error position.

(S1005) If it is judged that any of the values of C ($\alpha^j$) (j=0, 1, 2, 3, 4, . . . n) are not "0", the chien search execution section 268 judges that correction failed, and requests the data storage section 231 to send the next candidate.

Then using the syndrome polynomial and error locator polynomial, the error value calculation section 270 corrects an incorrect value of the error position of the data string to a correct value based on a predetermined algorithm. And the error value calculation section 270 deletes a parity string from the data string after correction, and outputs the result to the recording decoder (RLL decoder) 233 (see FIG. 1) in a subsequent stage.

In other words, if the correction of the first candidate succeeds, the corrected data string is output from the ECC decoder 232. If the correction fails and the second or later candidates need be decoded, decoding processing is performed using the information stored in the syndrome value storage section 262.

The selection of candidate data and the update of a syndrome will be described with reference to FIG. 9 to FIG. 11. For example, as shown in FIG. 9, if the first candidate consisting of n+1 symbols and a current decoding target candidate are compared, the symbol at position j=1 of the first candidate is $\alpha^{12}$, and the symbol at the same position of the decoding target candidate is $\alpha^6$, so the values are different.

In this case, the receive word polynomial Y1 (x) of the first candidate and the receive word polynomial Y (x) of the decoding target candidate are given by the following Expressions (10) and (11) respectively.

[Expression 10]

$$Y1(x)=\alpha^2 x^n+\alpha^{22}x^{n-1}+\ldots \alpha^{12}x+\alpha^5 \qquad (10)$$

[Expression 11]

$$Y(x)=\alpha^2 x^n+\alpha^{22}x^{n-1}+\ldots \alpha^6 x+\alpha^5 \qquad (11)$$

For these receive words, the syndrome polynomial S1 (x) of the first candidate and the syndrome polynomial S (x) of the decoding target candidate are given by the following Expressions (12) and (13).

[Expression 12]

$$S1(x)=s1_1+s1_2 x+\ldots +s1_{2t}x^{2t-1}+s1_{2t+1}x^{2t}$$

$$s1_i=Y1(\alpha^i)(i=1, 2, \ldots 2t, 2t+1) \qquad (12)$$

[Expression 13]

$$S(x)=s_1+s_2 x+\ldots +s_{2t}x^{2t-1}+s_{2t+1}x^{2t}$$

$$s_i=Y(\alpha^i)(i=1, 2, \ldots, 2t, 2t+1) \qquad (13)$$

In Expressions (12) and (13), s1i indicates the i-th syndrome of the first candidate, and si indicate the i-th syndrome of the decoding target candidate. In this case, si can be expressed as the following Expression (14) using s1i.

[Expression 14]

$$s_i = s1_i + Y(\alpha^i) - Y1(\alpha^i)$$
$$= s1_i + (\alpha^6 - \alpha^{12})\alpha^i \quad (14)$$

Expression (14) indicates that the value of the syndrome si after update is obtained by adding the product of the change amount of the symbol value ($\alpha^6$-$\alpha^{12}$) and $\alpha^i$ to the value of s1i stored in the syndrome value storage section 262.

Even when a plurality of values of symbols are different, the syndrome si after an update can be calculated in the same way as Expression (14). In this case, the difference of syndromes ($Y(\alpha^i)$–$Y1(\alpha^i)$) is a result when the product of the change amount of symbol values and $(\alpha^i)^j$ is added for all the positions j of which symbol values are different.

Using the syndrome si updated in this way, the polynomial $C_1(x)$ to $C_{2t+1}(x)$ are sequentially calculated by the Berlekamp Massey method. For example, in the case of t=20, the polynomials $C_1(x)$, $C_{40}(x)$ and $C_{41}(x)$ are calculated as the following Expression (15).

[Expression 15]

$$C_1(x)=1+\alpha x$$

$$C_{40}(x)=1+x+\alpha^2 x^2+\ldots \alpha^{35} x^{20}$$

$$C_{41}(x)=1+\alpha x+\alpha^{50} x^3+\ldots \alpha^{100} x^{20} \quad (15)$$

In the case of Expression (15), the coefficients $C_{40}(x)$ and $C_{41}(x)$ do not match, so it is judged that correction of the decoding target candidate failed, and the next candidate is decoded.

The next candidate will be described using an example of extracting two candidates. As FIG. 10 shows, error candidates are stored in the sequence of higher error probability in the error candidate storage 231. In other words, two candidates are selected from the 8 error candidates, and are flipped. The number of combinations of selecting two candidates out of the 8 candidates is $_8C_2$=28, and the error candidates are combined, as shown in FIG. 10.

For example, if the positions of the error candidates No. 1 and No. 2 are flipped, the values of the $102^{nd}$ bit indicated by No. 1 in the data string and the $415^{th}$ and $416^{th}$ bits indicated by No. 2 are flipped from "0" to "1" or "1" to "0". Then decoding is performed using the flipped bit strings.

The processing of the syndrome update section 264 will now be described with reference to the flow chart in FIG. 11.

(S701) As mentioned above, when the syndrome update section receives a request of the next candidate from the error locator polynomial calculation section 266 or chien search execution section 268, the syndrome update section 264 selects two candidates out of 8 according to the above mentioned sequence, flips the data at the bit positions of the candidate in the data string, and creates a decoding target data string. The syndrome update section 264 compares the decoding target data string and the candidate data string of the syndrome value storage section 262, and extracts different symbol values.

(S702) Then for all the positions j where symbols are different, the sum of the products of the change amount of the symbol and $(\alpha^i)^j$ is calculated, and this value is regarded as the difference of the syndromes ($Y(\alpha^i)$–$Y1(\alpha^i)$).

(S703) The difference is added to the syndromes stored in the syndrome value storage section 262 to update the syndromes.

In this way, the bit positions of which error probability is high are extracted as error candidates, which can be effectively corrected, can be provided to the ECC decoder 232, and decoding speed can be improved.

Also the error candidates are prepared so that the ECC decoder 232 can extract the error candidates in the sequence of lower likelihood, so decoding speed can be further improved, and even in this way, the number of times of sorting in the sequence of likelihood can be decreased, and calculation volume can be effectively decreased.

Also by combining with the ECC decoder 232 in FIG. 5, the syndromes of decoding target data strings can be created at high-speed when it is judged that the ECC decoder cannot make correction, and decoding with less calculation volume become possible.

Another Error Candidate Extractor

Figure 12:
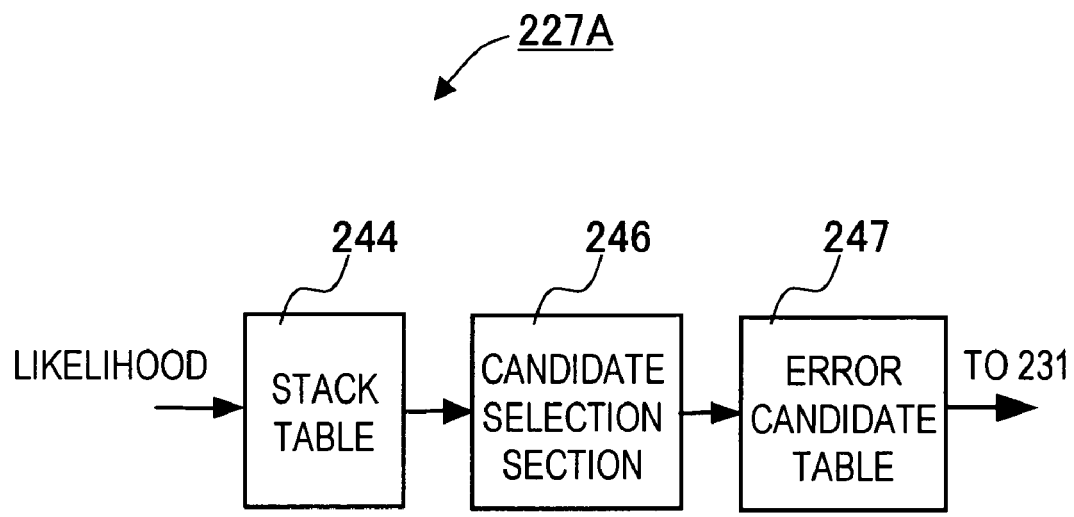
FIG. 12 is a block diagram depicting another embodiment of the error candidate extractor in FIG. 1.
Figures 14, 15, 16:
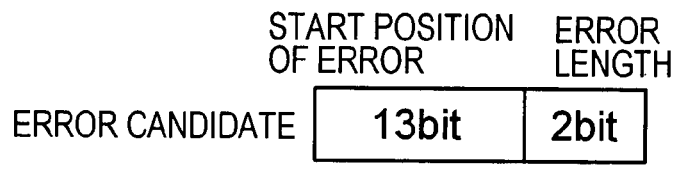
FIG. 14 is a diagram depicting an operation of the candidate selection section in FIG. 12.
FIG. 15 is a diagram explaining an output format of the candidate selection section in FIG. 12.
FIG. 16 is a diagram depicting the error candidate table in FIG. 12.
Figure 17:
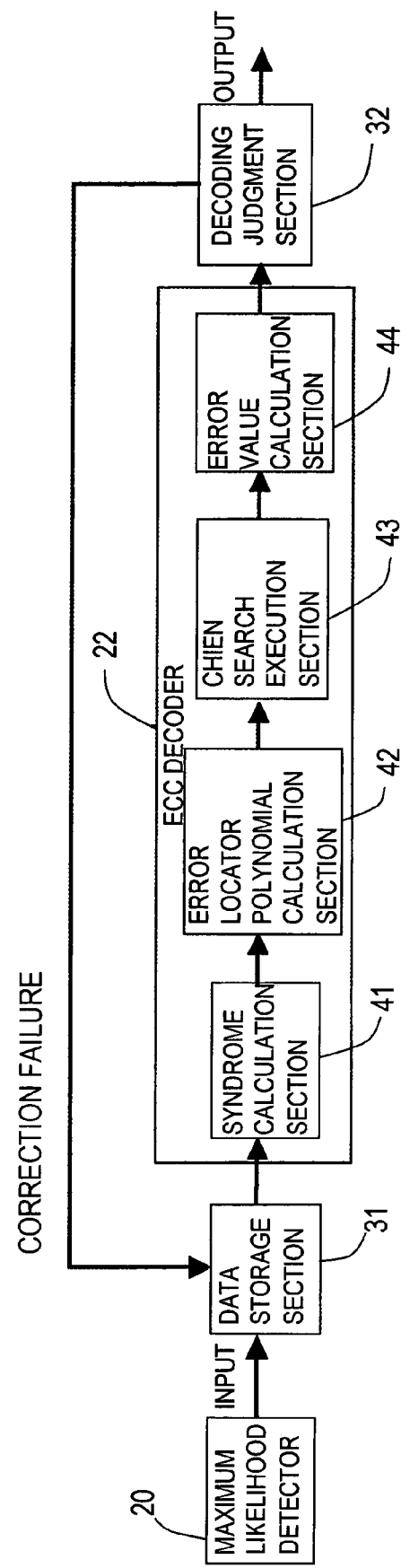
FIG. 17 is a block diagram depicting an error correction circuit according to a prior art.

FIG. 12 is a block diagram depicting another error candidate extractor in the configuration in FIG. 1, FIG. 13 shows a stack table of FIG. 12, FIG. 14 is a diagram depicting the candidate selection section in FIG. 12, FIG. 15 is a diagram depicting the output format of the candidate selection section in FIG. 12, and FIG. 16 shows the error candidate table in FIG. 12. In this example, the output format has been improved to decrease the memory capacity of the error candidate table.

As FIG. 12 shows, the error candidate extractor 227A has a stack table 244, a candidate selection section 246 and an error candidate table 247. The detector 226, such as SOVA, NSOVA or BCJR, in FIG. 1 calculates the likelihood of each bit of the data string (sector) as shown in FIG. 13. As the likelihood value becomes higher, the probability that the bit is correct becomes higher, and as the likelihood value becomes lower, the probability that the bit is an error becomes higher.

The stack table 244 stores the likelihood value of each bit for one sector from the detector 226. FIG. 13 shows a string of the likelihood values of each bit position for one sector. The candidate selection section 246 extracts a position of which likelihood value is low from the likelihood value of each bit in the stack table 246.

As FIG. 13 shows, the stack table 246 stores the likelihood value of each bit for one sector at the corresponding bit position. The candidate selection section 246, which must extract a bit of which probability of error is high, handles only the bits having low likelihood.

The candidate selection section 246 extracts a bit position of which absolute value of likelihood is lowest, a bit position of which absolute value of likelihood is second lowest, and a bit position of which absolute value of likelihood is third lowest, for example. If one sector is 4096 bits, for example, it is preferable that the bit positions of which likelihood is up to eighth lowest are extracted.

FIG. 14 shows a status when the candidate selection section 246 extracted the bit position "8" of which absolute value of likelihood is lowest (likelihood value 0.3), the bit position "22" of which absolute value of likelihood is second lowest (likelihood value 0.4), the continuous bit positions "25" and "26" of which absolute values of likelihood are third lowest (likelihood values 0.6), and absolute values "0.3", "0.4" and "0.6" of these likelihood values from the likelihood values of the bits for one sector in the stack table 244 in FIG. 13.

The candidate selection section 246 creates a list in which the extracted bit positions are arranged in the sequence of likelihood as shown in FIG. 14. Then the candidate selection section 246 converts the created list, where the bit positions in the sequence of lower likelihood are regarded as error candidate 1, 2, 3, . . . , respectively, into a predetermined output format to create an error candidate table 247.

As FIG. 15 shows, the output format into which the created list is converted as the error candidate information is comprised of a start position of the candidate bits, and an error length. The candidate selection section 246 creates a table, which is comprised of a start position of candidate bits in one sector, and the error length, in the error candidate table 247, and outputs the results to the error candidate storage unit 231 of the HDC 203.

The output format has 15 bits of error candidate information, for example, where the error start position is entered in the first 13 bits, and the error length is entered in the last 2 bits, as shown in FIG. 15.

The list conversion method will now be described with reference to FIG. 16. The bit position "8" of the error candidate 1 indicates that 1 bit error exists on the eighth bit of one sector, so the binary notation of 8 "0000000000100" is entered for the first 13 bits, and the error length 1 bit "01" is entered for the remaining 2 bits.

The bit position "22" of the error candidate 2 indicates that 1 bit error exists on the twenty second bit, so the binary notation of 22 "0000000010110" is entered for the first 13 bits, and the error length 1 bit "01" is entered for the remaining 2 bits.

The bit positions "25" and "26" of the error candidate 3 indicate that a 2 bit error exists on the twenty fifth and twenty sixth bits, so the binary notation of the error start position 25 "0000000011001" is entered for the first 13 bits, and the error length 2 bits "10" is entered for the remaining 2 bits.

Since the error length is represented by 2 bits, the longest error is simply a maximum 3 bits. However, similar to the example in FIG. 4 if an MTR code for suppressing continuous error is used as a recording code, that is if 16/17 MTR code is used for encoding 16 bit data to 17 bit data, the generation of a 4 bit or longer continuous error can be prevented. Therefore, it is sufficiently when using MTR.

As a result, even if a string of continuous 4 bits having the lowest absolute likelihood value exists in FIG. 16, a continuous 4 bit error is not generated according to the encoding principle, so this bit string is not regarded as an error candidate, but is ignored.

In this way, by making the output format of a start position of error candidate bits and error length, the memory volume of the error candidate table can be decreased, and the configuration of the read channel 202 can be simplified. For example, if the bit position is represented by 13 bits, 24×13=312 bits of capacity is required in the case of FIG. 4. Such a case as FIG. 4 can only be 8×15=120 bits if the present embodiment is used, and only about a ⅓ memory capacity is required.

Other Embodiments

In the above embodiments, two error candidates are selected in each likelihood level, but one or three or more may be selected. The configuration of the ECC decoder is not limited to the configuration in FIG. 5, but other configurations may be used. Also the case of using the recording/reproducing device of a magnetic disk device was described above, but the present invention can be applied to other medium storage devices, such as an optical disk device, and to other communication devices.

The present invention was described using embodiments, but the present invention can be modified in various ways within the scope of the essential character thereof, and these variant forms shall not be excluded from the scope of the present invention.

What is claimed is:

1. An error correction circuit, comprising:
a detector which creates a decoding target data string from input signals and detects a likelihood of each bit of the decoding target data string;
an error candidate extractor which receives the likelihood of each bit and stores bit positions of which likelihood is a predetermined threshold or less into an error candidate table in order of vales of the likelihood; and
a correction circuit which corrects an error of the decoding target data string and outputs corrected decoding target data,
wherein the correction circuit, when judging that the correction has failed, extracts the bit position of the error candidates from the error candidate table, creates a new decoding target data string by flipping bit information which corresponds to the bit position in the decoding target data string, and judges whether the correction is successful.

2. The error correction circuit according to claim 1, wherein the error candidate extractor comprises:
a threshold judgment section which compares a likelihood of each bit of the decoding target data string and a predetermined threshold, and extracts bit positions of which likelihood is the predetermined threshold or less; and
a higher candidate selection section which creates the error candidate table which stores the extracted bit positions as selected error candidates.

3. The error correction circuit according to claim 2, wherein the higher candidate selection section stores the bit positions, of which absolute values of the likelihood are the same, into the error correction table as one selected error candidate.

4. The error correction circuit according to claim 2, wherein the threshold judgment section stores the extracted bit positions of which likelihood is a predetermined threshold or less and the likelihood into a stack table according to a plurality of likelihood levels.

5. The error correction circuit according to claim 4, wherein the higher candidate selection section refers to the stack table for each likelihood level, and stores the bit positions of the selected error candidates in the order of the likelihood.

6. The error correction circuit according to claim 5, wherein the higher candidate selection section refers to the stack table for each likelihood level, stores the bit positions of which the likelihood level is relatively low in the stack table into the error candidate table, sorts the bit positions of which likelihood level is relatively high in the stack table, and stores the sorted bit positions into the error candidate table.

7. The error correction circuit according to claim 1, wherein the error candidate extractor detects that bits, of which likelihood is a threshold or less, continue for a predetermined number of bits, and disables storing the continuous bit positions into the table.

8. The error correction circuit according to claim 1, wherein the correction circuit comprises:
a syndrome calculation section which calculates a set of syndromes from the decoding target data string;
an error locator polynomial calculation section which calculates coefficients of an error locator polynomial from the set of syndromes, judges whether correction succeeds or not in use of the coefficients of the error locator polynomial, and requests the error candidate to the error candidate table when the judgment result is a correction failure; and a correction circuit which corrects an error of the decoding target data string in use of the syndromes and the coefficients of the error locator polynomial according to the judgment result on success of the correction of the error locator polynomial calculation section.

9. The error correction circuit according to claim 8, wherein the correction circuit comprises:

a syndrome holding section which holds the calculated syndromes; and a syndrome update section which calculates a difference of the syndromes from the difference between the decoding target data string and the new decoding target data string, and updates the held syndromes by the difference.

10. The error correction circuit according to claim 1, wherein the error candidate extractor creates the table with a format of a start position and an error length of extracted bit positions.

11. A medium storage device, comprising:

a head which reads signals from a storage medium;

a detector which creates a decoding target data string from the read signals of the head and detects a likelihood of each bit of the decoding target data string;

an error candidate extractor which receives the likelihood of each bit and stores bit positions of which likelihood is a predetermined threshold or less into an error candidate table in order of vales of the likelihood; and a correction circuit which corrects an error of the decoding target data string and outputs corrected decoding target data, wherein when judging that the correction has failed, the correction circuit extracts the bit position of the error candidates from the error candidate table, creates a new decoding target data string by flipping bit information which corresponds to the bit position in the decoding target data string, and judges whether the correction is successful.

12. The medium storage device according to claim 11, wherein the error candidate extractor comprises:

a threshold judgment section which compares a likelihood of each bit of the decoding target data string and a predetermined threshold, and extracts bit positions of which likelihood is the predetermined threshold or less; and a higher candidate selection section which creates the error candidate table which stores the extracted bit positions as selected error candidates.

13. The medium storage device according to claim 11, wherein the correction circuit comprises:

a syndrome calculation section which calculates a set of syndromes from the decoding target data string;

an error locator polynomial calculation section which calculates coefficients of an error locator polynomial from the set of syndromes, judges whether correction succeeds or not in use of the coefficients of the error locator polynomial, and requests the error candidate to the error candidate table when the judgment result is a correction failure; and a correction circuit which corrects an error of the decoding target data string in use of the syndromes and the coefficients of the error locator polynomial according to the judgment result on the success of the correction of the error locator polynomial calculation section.

14. The medium storage device according to claim 11, wherein the correction circuit comprises:

a syndrome holding section which holds the calculated syndromes; and a syndrome update section which calculates a difference of the syndromes from the difference between the decoding target data string and the new decoding target data string, and updates the held syndromes by the difference.

15. The medium storage device according to claim 11, wherein the error candidate extractor creates the table with a format of a start position and an error length of extracted bit positions.

* * * * *